United States Patent
Sun

(10) Patent No.: US 10,892,266 B2
(45) Date of Patent: Jan. 12, 2021

(54) NONVOLATILE MEMORY STRUCTURE AND ARRAY

(71) Applicant: eMemory Technology Inc., Hsinchu (TW)

(72) Inventor: Wein-Town Sun, Taoyuan (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 16/122,898

(22) Filed: Sep. 6, 2018

(65) Prior Publication Data
US 2019/0006378 A1    Jan. 3, 2019

Related U.S. Application Data

(63) Continuation-in-part of application No. 15/252,244, filed on Aug. 31, 2016, now Pat. No. 10,262,746.

(60) Provisional application No. 62/571,833, filed on Oct. 13, 2017, provisional application No. 62/280,683, filed on Jan. 19, 2016.

(51) Int. Cl.
| | |
|---|---|
| *H01L 27/11524* | (2017.01) |
| *H01L 27/02* | (2006.01) |
| *H01L 27/11558* | (2017.01) |
| *H01L 27/11519* | (2017.01) |

(52) U.S. Cl.
CPC .... *H01L 27/11524* (2013.01); *H01L 27/0207* (2013.01); *H01L 27/11519* (2013.01); *H01L 27/11558* (2013.01)

(58) Field of Classification Search
None
See application file for complete search history.

(56) References Cited

U.S. PATENT DOCUMENTS

| | | |
|---|---|---|
| 5,592,001 A | 1/1997 | Ksano |
| 7,768,059 B2 | 8/2010 | Chen et al. |
| 8,351,254 B2 * | 1/2013 | Taniguchi .......... G11C 16/0433 257/315 |
| 8,363,470 B2 | 1/2013 | Tailliet |
| 2003/0235082 A1 | 12/2003 | Hsu et al. |

(Continued)

FOREIGN PATENT DOCUMENTS

| | | |
|---|---|---|
| CN | 103943570 | 7/2014 |
| CN | 104517966 | 4/2015 |

OTHER PUBLICATIONS

"Office Action of China Counterpart Application," dated May 7, 2019, p. 1-p. 8.

(Continued)

*Primary Examiner* — Abul Kalam
(74) *Attorney, Agent, or Firm* — JCIPRNET

(57) ABSTRACT

A nonvolatile memory structure includes a substrate, a select transistor, and a floating-gate transistor. The substrate includes an oxide defined (OD) region and an erase region. The select transistor is disposed on the OD region, and the floating-gate transistor is disposed on the OD region between the select transistor and the erase region, wherein the floating gate has an extended portion capacitively coupled to the erase region, and the extended portion has an extending direction parallel to a first direction. The OD region further has an addition region protruding in a second direction and partially overlapped with the floating gate, in which the second direction is vertical to the first direction.

24 Claims, 8 Drawing Sheets

(56) References Cited

U.S. PATENT DOCUMENTS

| | | |
|---|---|---|
| 2005/0029577 A1 | 2/2005 | Nishizaka et al. |
| 2007/0007575 A1 | 1/2007 | Ding |
| 2009/0159946 A1 | 6/2009 | Huang et al. |
| 2010/0329016 A1 | 12/2010 | Taniguchi |
| 2013/0075803 A1 | 3/2013 | Edrei et al. |
| 2015/0311219 A1* | 10/2015 | Taniguchi .......... G11C 16/0441 257/300 |

OTHER PUBLICATIONS

Liou et al., "Characterization of process-induced mobile ions on the data retention in flash memory," IEEE Transactions on Electron Devices, Jun. 25, 2003, pp. 995-100.

* cited by examiner

NONVOLATILE MEMORY STRUCTURE AND ARRAY

CROSS-REFERENCE TO RELATED APPLICATION

This application is a continuation-in-part application of and claims the priority benefit of U.S. application Ser. No. 15/252,244, filed on Aug. 31, 2016, now pending, which claims the priority benefit of U.S. provisional application Ser. No. 62/280,683, filed on Jan. 19, 2016. This application also claims the priority benefit of U.S. provisional application Ser. No. 62/571,833, filed on Oct. 13, 2017. The entirety of each of the above-mentioned patent applications is hereby incorporated by reference herein and made a part of this specification.

BACKGROUND

Technical Field

The present invention relates to a nonvolatile memory, and more particularly, to a nonvolatile memory structure and an array for improving coupling ratio difference due to overlap shift.

Description of Related Art

Nonvolatile memory is widely applied in various electrical apparatus because it can retain information even no power is supplied thereto. 2-cells-per-bit nonvolatile memory structure is developed with good data retention capability, which has two charge storage regions for writing and reading information.

FIG. 1 is a schematic plan view of conventional 2-cells-per-bit nonvolatile memory structure. In FIG. 1, two nonvolatile memory cells 100 share one erase line 102. Each of the nonvolatile memory cells 100 includes two active regions 104a-b, two floating gates 106 a-b, and two select gates 108 a-b, wherein the select gates 108 a-b are electrically connected to a word line WL.

However, if a misalignment is occurred between the floating gates 106 a-b and the active regions 104a-b along Y axis, the overlapping areas 110a and 110b between the floating gates 106 a-b and the erase line 102 will be a big different. The area difference is related to the difference in coupling ratio, resulting in different erase speed.

Therefore, there is a need to solve the above-mentioned different coupling ratio problems caused by misalignment.

SUMMARY

Accordingly, the present invention is directed to a nonvolatile memory structure with addition OD regions for reducing the difference in coupling ratio.

The present invention is further directed to an array including the nonvolatile memory structure.

A nonvolatile memory structure according to another embodiment of the invention includes a substrate, a select transistor, and a floating-gate transistor. The substrate includes an oxide defined (OD) region and an erase region. The select transistor is disposed on the OD region, and the floating-gate transistor is disposed on the OD region between the select transistor and the erase region, wherein the floating gate has an extended portion capacitively coupled to the erase region, and the extended portion has an extending direction parallel to a first direction. The OD region further has an addition region protruding in a second direction and partially overlapped with the floating gate, wherein the second direction is vertical to the first direction.

An array according to another embodiment of the invention includes a plurality of the foregoing nonvolatile memory structures.

A nonvolatile memory structure according to yet another embodiment of the invention includes a substrate, a first select transistor, a first floating-gate transistor, a second select transistor, and a second floating-gate transistor. The substrate includes a first oxide defined (OD) region, a second OD region, and an erase region, wherein the first OD region and the second OD region are arranged in parallel along a first direction, and the erase region is extended along a second direction. The first select transistor is disposed on the first OD region. The first floating-gate transistor is disposed on the first OD region between the first select transistor and the erase region, wherein the first floating-gate transistor includes a first floating gate having an extended portion capacitively coupled to the erase region. The second select transistor is disposed on the second OD region. The second floating-gate transistor is disposed on the second OD region between the second select transistor and the erase region, wherein the second floating-gate transistor includes a second floating gate having an extended portion capacitively coupled to the erase region. The first OD region has at least one first addition region protruding in the second direction and partially overlapped with the first floating gate. The second OD region has at least one second addition region protruding in the second direction and partially overlapped with the second floating gate.

An array according to still yet another embodiment of the invention includes a plurality of the foregoing nonvolatile memory structures, in which two of the nonvolatile memory structures share the one erase region, and the two of the nonvolatile memory structures are arranged symmetrically on two sides of the one erase region respectively.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
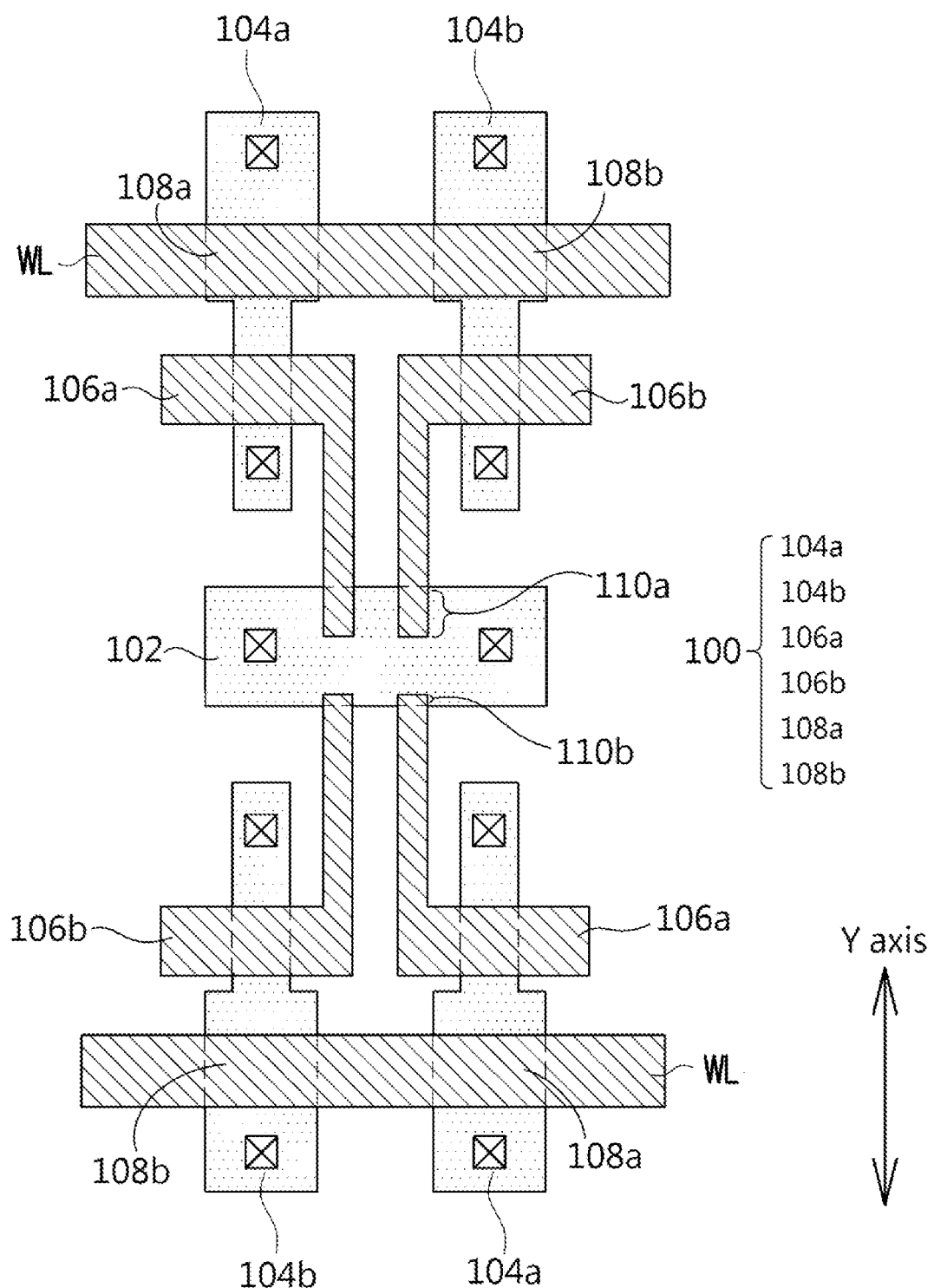
FIG. 1 is a schematic plan view of conventional 2-cells-per-bit nonvolatile memory structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
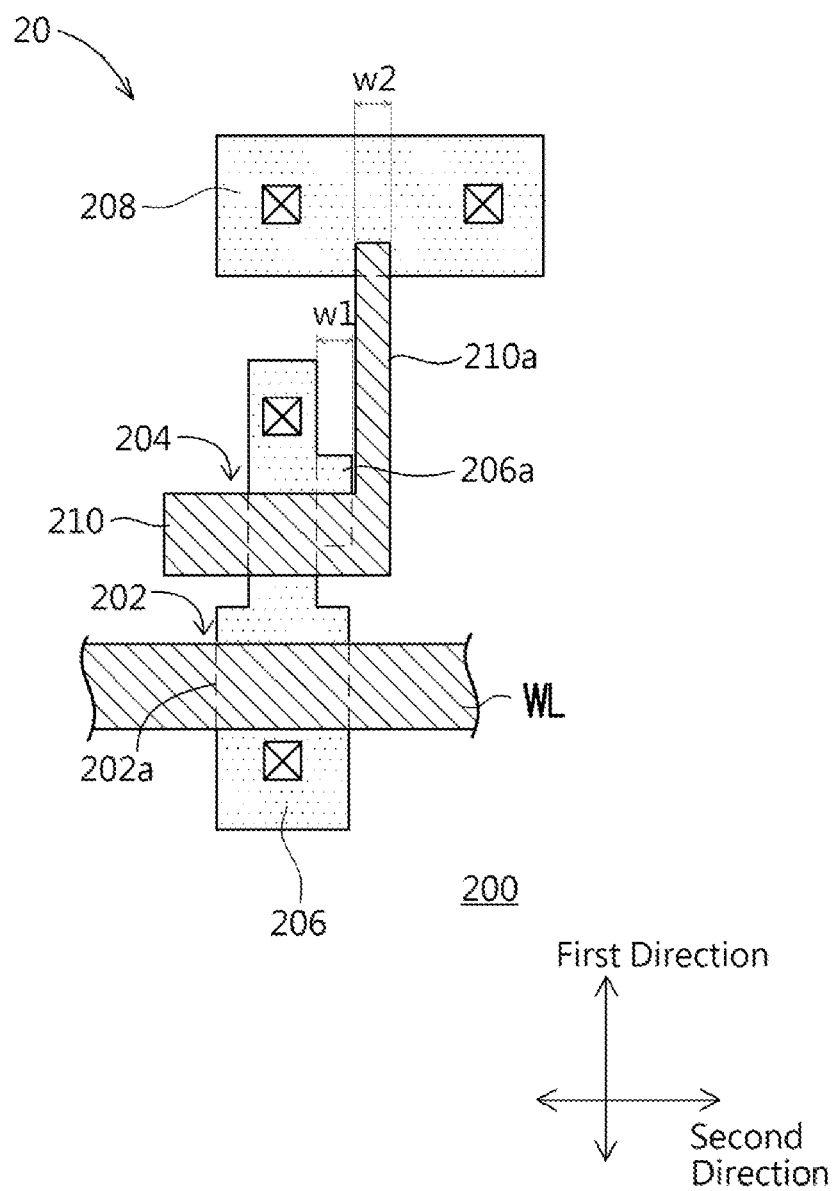
FIG. 2 is a schematic plan view of a layout of a nonvolatile memory structure in accordance with a first embodiment of this invention.

FIG. 2 is a schematic plan view of a layout of a nonvolatile memory structure in accordance with a first embodiment of this invention.

With reference to FIG. 2, a nonvolatile memory structure 20 at least includes a substrate 200, a select transistor 202, and a floating-gate transistor 204. The substrate 200 includes an oxide defined (OD) region 206 and an erase region 208. The term "oxide defined (OD) region" ("OD" region is sometimes referred to as "oxide definition" region) is commonly known in this technical field to be defined as a region on a silicon main surface of the substrate 200 other than a local oxidation of silicon (LOCOS) or a shallow trench isolation (STI) region. The term "oxide defined (OD) region" is also commonly referred to as an "OD region" where the active circuit elements such as transistors are formed and operated. The erase region 208 has a first conductive type, the OD region 206 has a second conductive type. For instance, the first conductive type is p type, and the second conductive type is n type; vice versa.

The select transistor 202 is disposed on the OD region 206, and it includes a select gate 202a. The floating-gate transistor 204 is disposed on the OD region 206 between the select transistor 202 and the erase region 208, wherein the floating-gate transistor 204 includes a floating gate 210 having an extended portion 210a capacitively coupled to the erase region 208. The extended portion 210a of the floating gate 210 has an extending direction parallel to a first direction. The nonvolatile memory structure 20 may further include a word line WL disposed on the select transistor 202 along a second direction, wherein the second direction is vertical to the first direction. The select gate 202a is electrically connected to the word line WL.

In FIG. 2, the OD region 206 has an addition region 206a protruding in the second direction and partially overlapped with the floating gate 210. The addition region 206a is disposed at one side of the OD region 206, but it is not limited thereto. The area of the addition region 206a is A1, an overlap area between the floating gate 210 and the addition region 206a is A2, and a ratio of A2 to A1 is, for instance, 0.5 or more in view of reducing the difference of coupling ratio. Moreover, in one embodiment, a width w1 of the addition region 206a is equal to or more than a width w2 of the extended portion 210a of the floating gate 210, but it is not limited thereto. If there are two addition regions 206a disposed at two sides of the OD region 206, the width w1 of the addition region 206a may be less than the width w2 of the extended portion 210a.

Figure 3:
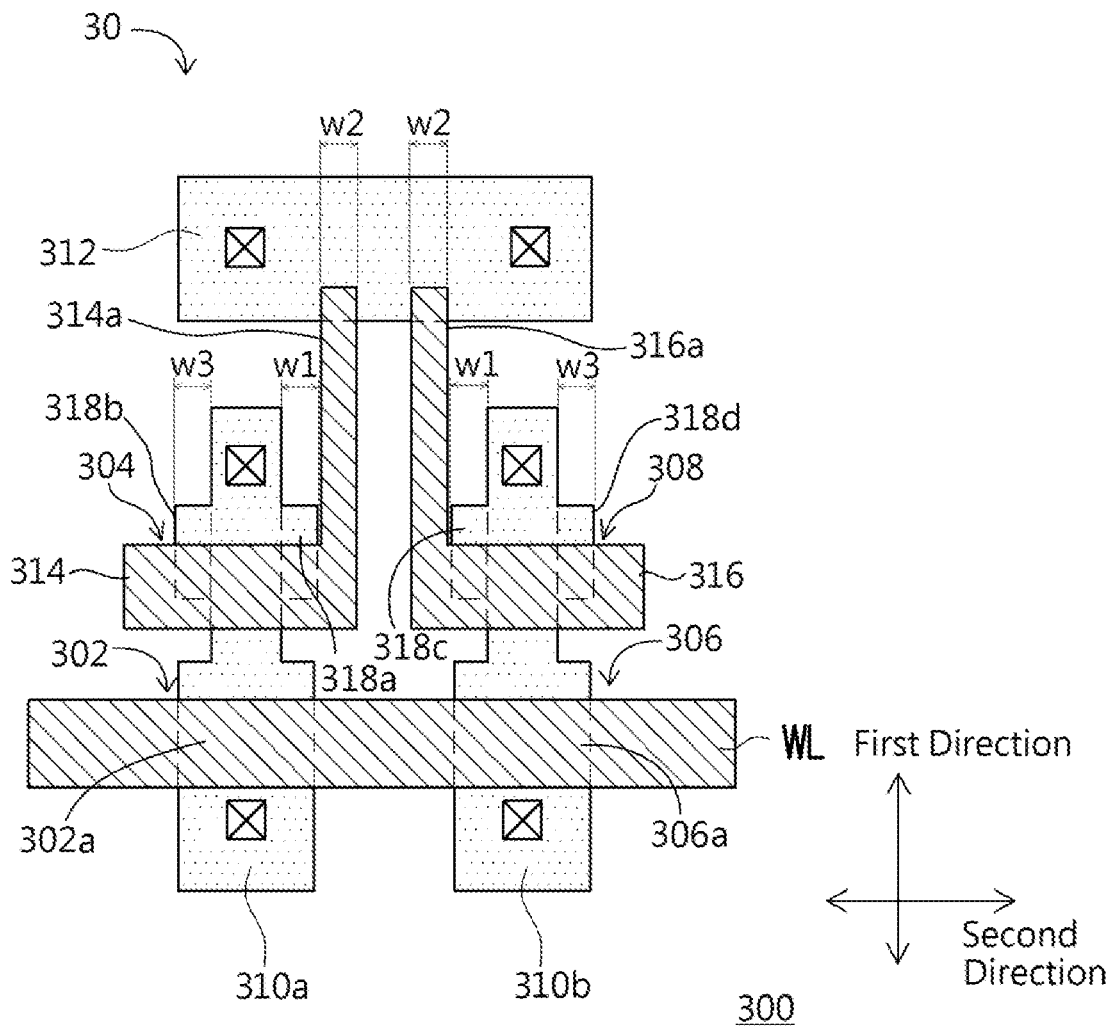
FIG. 3 is a schematic plan view of a layout of a nonvolatile memory structure in accordance with a second embodiment of this invention.

FIG. 3 is a schematic plan view of a layout of a nonvolatile memory structure in accordance with the second embodiment of this invention.

With reference to FIG. 3, a nonvolatile memory structure 30 at least includes a substrate 300, a first select transistor 302, a first floating-gate transistor 304, a second select transistor 306, and a second floating-gate transistor 308. The substrate 300 includes a first oxide defined (OD) region 310a, a second OD region 310b, and an erase region 312. The term "oxide defined (OD) region" ("OD" region is sometimes referred to as "oxide definition" region) is commonly known in this technical field to be defined as a region on a silicon main surface of the substrate 300 other than a local oxidation of silicon (LOCOS) or a shallow trench isolation (STI) region. The term "oxide defined (OD) region" is also commonly referred to as an "OD region" where the active circuit elements such as transistors are formed and operated. The first OD region 310a and the second OD region 310b are arranged in parallel along a first direction, and the erase region 312 is extended along a second direction. The erase region 312 has a first conductive type, the first OD region 310a and the second OD region 310b have a second conductive type. For instance, the first conductive type is p type, and the second conductive type is n type; vice versa.

The first select transistor 302 is disposed on the first OD region 310a, and it includes a select gate 302a. The first floating-gate transistor 304 is disposed on the first OD region 310a between the first select transistor 302 and the erase region 312, wherein the first floating-gate transistor 304 includes a first floating gate 314 having an extended portion 314a capacitively coupled to the erase region 312. The second select transistor 306 is disposed on the second OD region 310b, and it includes a select gate 306a. The second floating-gate transistor 308 is disposed on the second OD region 310b between the second select transistor 306 and the erase region 312, wherein the second floating-gate transistor 308 includes a second floating gate 316 having an extended portion 316a capacitively coupled to the erase region 312. As shown in FIG. 3, the extended portion 314a of the first floating gate 314 and the extended portion 316a of the second floating gate 316 are disposed between the first OD region 310a and the second OD region 310b, but t is not limited thereto. The extended portion 314a of the first floating gate 314 has an extending direction parallel to the first direction, and the extended portion 316a of the second floating gate 316 also has an extending direction parallel to the first direction. The nonvolatile memory structure 30 may further include a word line WL disposed on the first select transistor 302 and the second select transistor 306 along the second direction, and the select gates 302a and 306a are electrically connected to the word line WL.

In FIG. 3, the first OD region 310a has two first addition regions 318a and 318b protruding in the second direction and partially overlapped with the first floating gate 314, and the second OD region 310b has two second addition regions 318c and 318d protruding in the second direction and partially overlapped with the second floating gate 316. The first addition regions 318a and 318b are disposed at two sides of the first OD region 310a, and the second addition regions 318c and 318d are disposed at two sides of the second OD region 310b, but it is not limited thereto. In other embodiments, the first OD region 310a and the second OD region 310b may respectively have one addition region as FIG. 2, and the addition regions of the first and second OD regions 310a and 310b may be disposed face to face, or alternatively, disposed outsides of the first OD region 310a and the second OD region 310b respectively. The total area of the first addition regions 318a and 318b is A1, an overlap area between the first floating gate 314 and the first addition regions 318a and 318b is A2, and a ratio of A2 to A1 is, for instance, 0.5 or more in view of reducing the difference of coupling ratio. The area of the second addition regions 318c and 318d is A3, an overlap area between the second floating gate 316 and the second addition regions 318c and 318d is A4, and a ratio of A4 to A3 is, for instance, 0.5 or more in view of reducing the difference of coupling ratio. Moreover, in one embodiment, a width w1 of the first addition region 318a or a width w3 of the first addition region 318b is less than a width w2 of the extended portion 314a of the first floating gate 314, and a width w1 of the second addition region 318c or a width w3 of the second addition region 318d is less than a width w2 of the extended portion 316a of the second floating gate 316, but it is not limited thereto. In view of effectively reducing the coupling ratio difference, the sum of w1 and w3 of the first or second OD regions 310a or 310b is equal to or more than w2.

Figure 4:
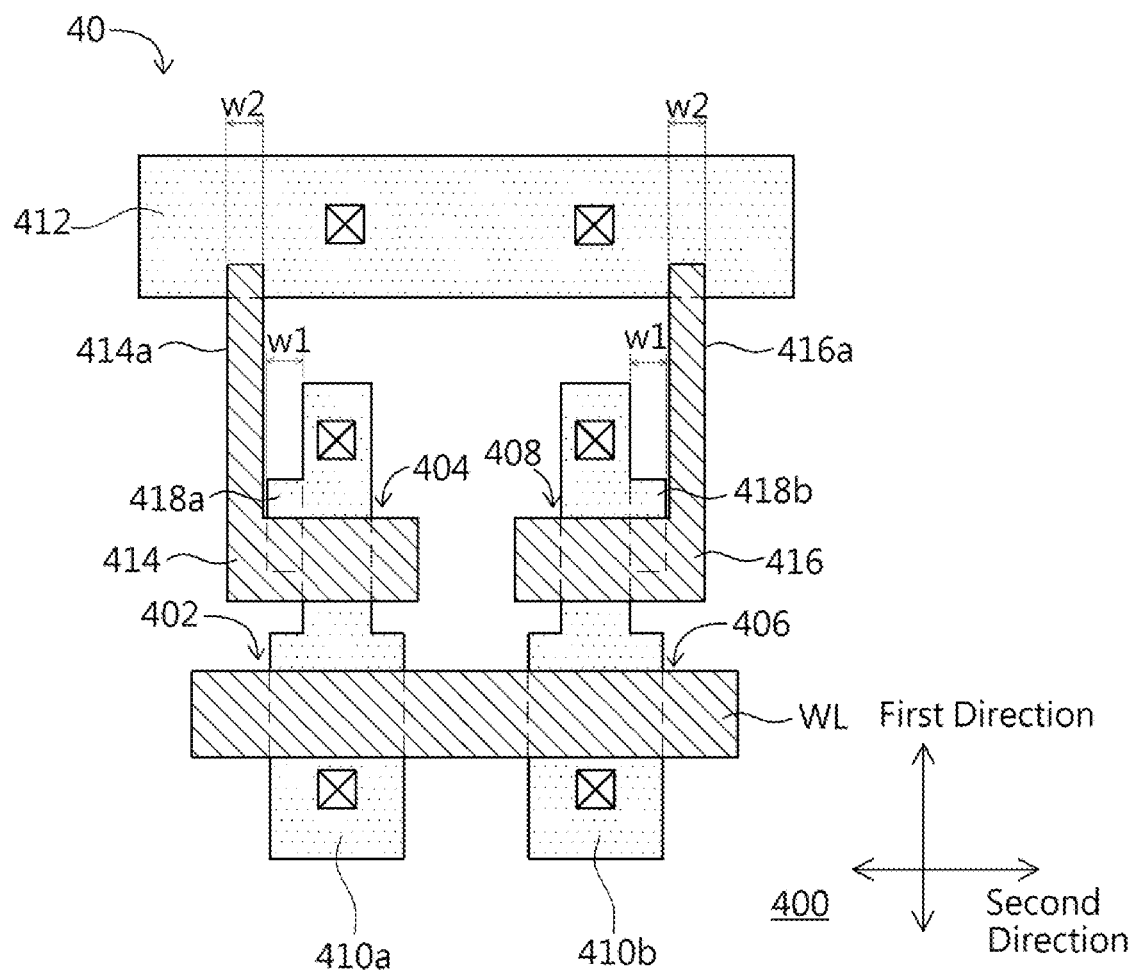
FIG. 4 is a schematic plan view of a layout of a nonvolatile memory structure in accordance with a third embodiment of this invention.

FIG. 4 is a schematic plan view of a layout of a nonvolatile memory structure in accordance with a third embodiment of this invention.

With reference to FIG. 4, a nonvolatile memory structure 40 at least includes a substrate 400, a first select transistor 402, a first floating-gate transistor 404, a second select transistor 406, and a second floating-gate transistor 408. The substrate 400 includes a first OD region 410a, a second OD region 410b, and an erase region 412. The first OD region 410a and the second OD region 410b are arranged in parallel along a first direction, and the erase region 412 is extended along a second direction. The erase region 412 has a first conductive type such as n type, and the first OD region 410a and the second OD region 410b have a second conductive type such as p type. The first select transistor 402 is disposed on the first OD region 410a, and the first floating-gate transistor 404 is disposed on the first OD region 410a between the first select transistor 402 and the erase region 412, wherein the first floating-gate transistor 404 includes a first floating gate 414 having an extended portion 414a capacitively coupled to the erase region 412. The second select transistor 406 is disposed on the second OD region 410b, and the second floating-gate transistor 408 is disposed on the second OD region 410b between the second select transistor 406 and the erase region 412, wherein the second floating-gate transistor 408 includes a second floating gate 416 having an extended portion 416a capacitively coupled to the erase region 412. The extended portion 414a of the first floating gate 414 and the extended portion 416a of the second floating gate 416 are disposed outside the first OD region 410a and the second OD region 410b. The extended portion 414a of the first floating gate 414 has an extending direction parallel to the first direction, and the extended portion 416a of the second floating gate 416 also has an extending direction parallel to the first direction. The nonvolatile memory structure 40 may further include a word line WL disposed on the first select transistor 402 and the second select transistor 406 along the second direction.

In FIG. 4, the first OD region 410a has a first addition region 418a protruding in the second direction and partially overlapped with the first floating gate 414, and the second OD region 410b has a second addition region 418b protruding in the second direction and partially overlapped with the second floating gate 416. The first addition region 418a is disposed at one side of the first OD region 410a, and the second addition region 418b is disposed at one side of the second OD region 410b. However, it is not limited thereto, the first addition region 418a may be disposed at both sides of the first OD region 410a, and the second addition region 418b may be disposed at both sides of the second OD region 410b. The area of the first addition region 418a is A1, an overlap area between the first floating gate 414 and the first addition region 418a is A2, and a ratio of A2 to A1 is, for instance, 0.5 or more in view of reducing the difference of coupling ratio. The area of the second addition region 418b is A3, an overlap area between the second floating gate 416 and the second addition region 418b is A4, and a ratio of A4 to A3 is, for instance, 0.5 or more in view of reducing the difference of coupling ratio. Moreover, in one embodiment, a width w1 of the first addition region 418a is equal to or more than a width w2 of the extended portion 414a of the first floating gate 414, and a width w1 of the second addition region 418b is equal to or more than a width w2 of the extended portion 416a of the second floating gate 416.

Figure 5A:
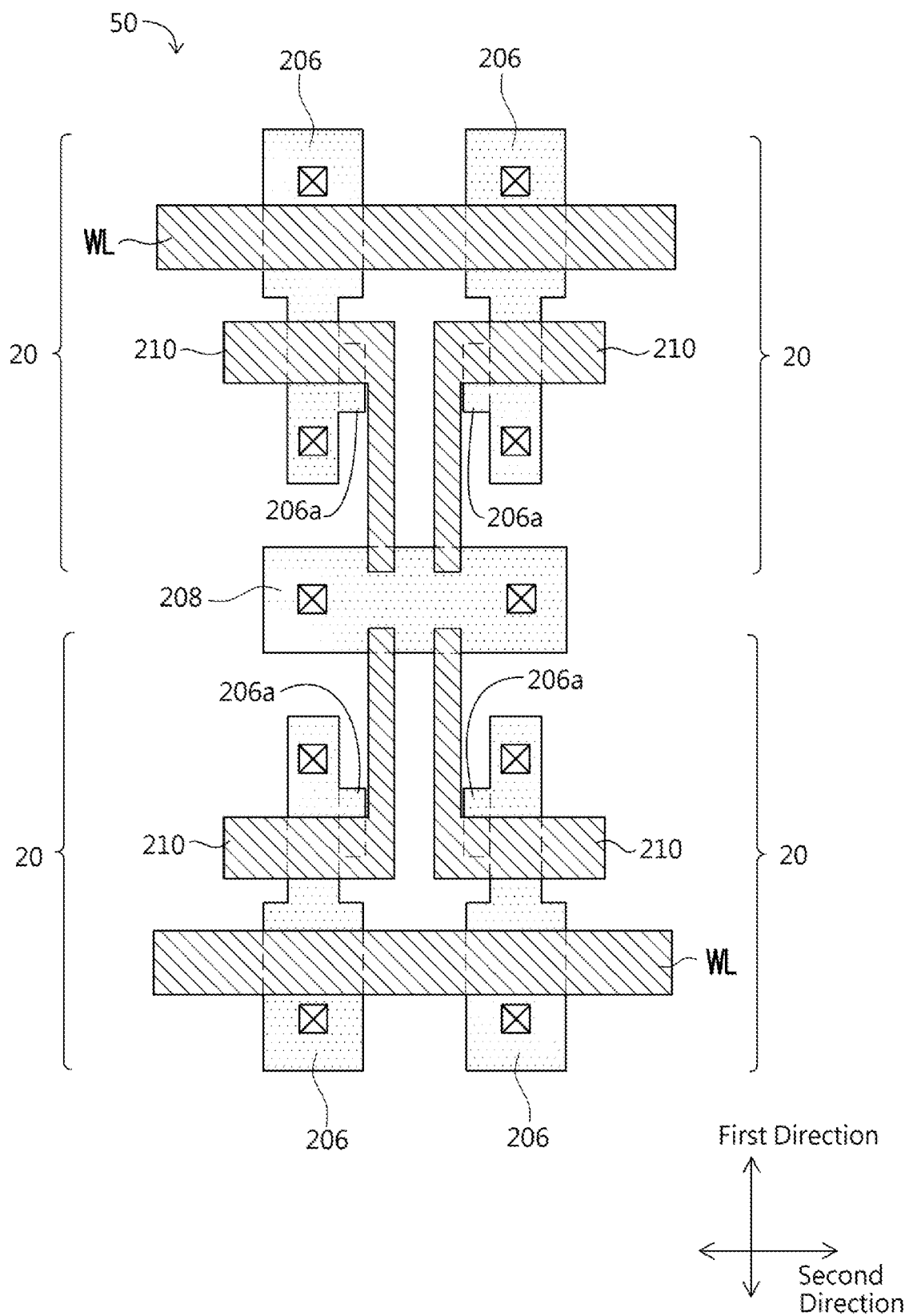
FIG. 5A is a schematic plan view of a layout of an array of the nonvolatile memory structure as set forth in FIG. 2.

FIG. 5A is a schematic plan view of a layout of an array of the nonvolatile memory structure as set forth in FIG. 2.

With reference to FIG. 5A, an array 50 includes four nonvolatile memory structures 20, in which four nonvolatile memory structures 20 share one erase region 208, and the other elements can be referred to the first embodiment of this invention. However, the present invention is not limited thereto. For example, each nonvolatile memory structures 20 may be corresponding to one erase region 208, and thus the number of the erase region 208 is also four.

Figure 5B:
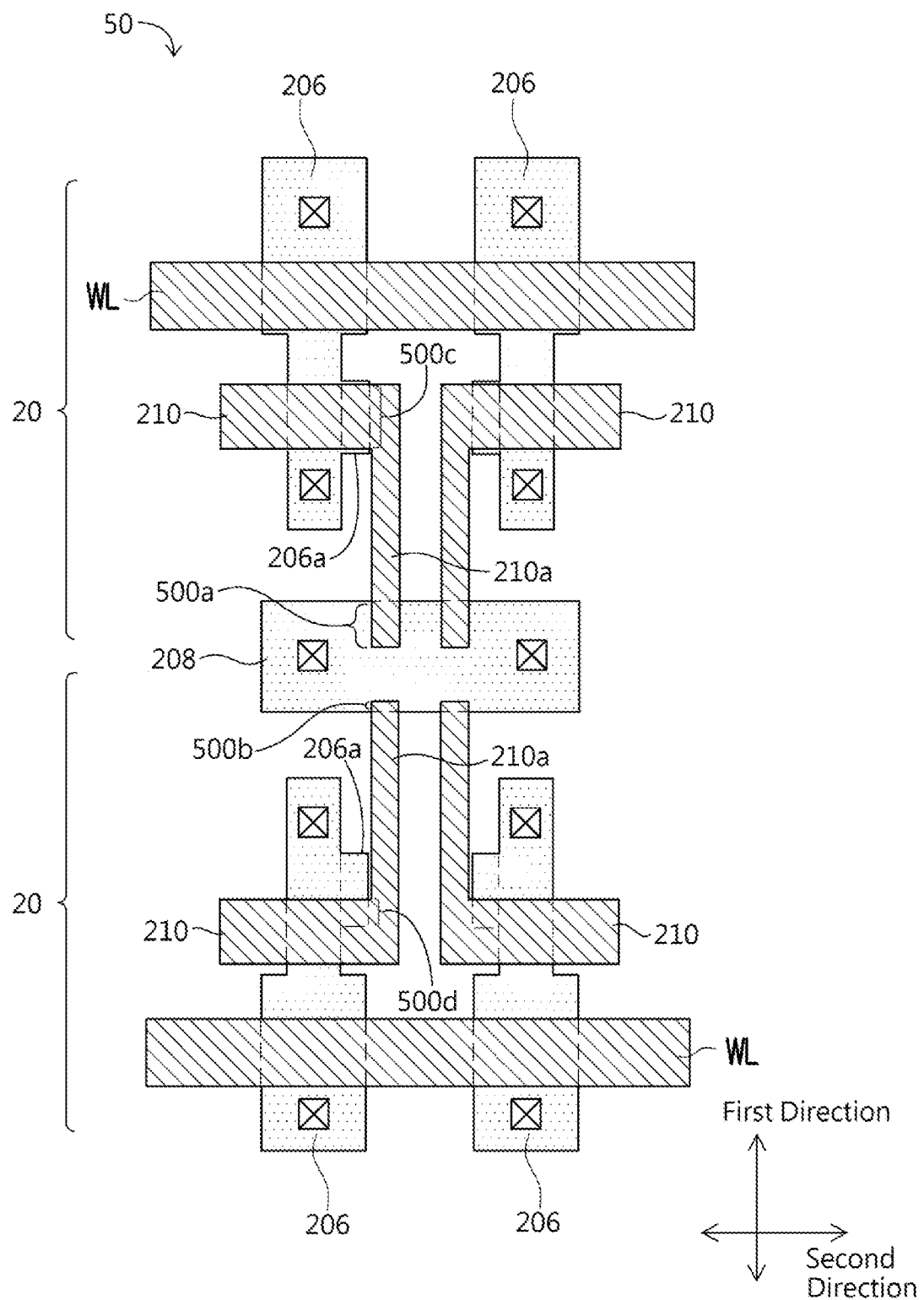
FIG. 5B is a schematic plan view illustrating the array of FIG. 5A with misalignment.

If a misalignment is occurred between the floating gates 210 along the first direction, the overlapping area 500a between the extend portion 210a and the erase region 208 of the lower nonvolatile memory structure 20 would be different from the overlapping area 500b between the extend portion 210a and the erase region 208 of the upper nonvolatile memory structure 20 as shown in FIG. 5B. Since the coupling ratio is defined as $C_{FG}/(C_{FG}+C_{EG})$ in which $C_{FG}$ represents the capacitance under the floating gate and $C_{EG}$ represents the capacitance under the overlapping area, and thus the addition region 206a can reduce the difference in coupling ratio. For example, the overlapping area 500a is grater that the overlapping area 500b, but the overlapping area 500c between the addition region 206b and the floating gate 206 of the upper nonvolatile memory structure 20 is also greater than the overlapping area 500d between the addition region 206a and the floating gate 206 of the lower nonvolatile memory structure 20. The capacitance under floating gate may change positively with the overlapping area 500c, and thus the change of coupling ratio can be alleviated.

Several experiments are provided below for verifying effects of the invention, but the contents of the experiments are not intent to limit the scope of the invention.

<Standard>

An array of FIG. 5A without addition regions is prepared as standard sample in which no misalignment is between floating gate and OD regions. The overlapping area between the extend portion and the erase region is set to be 0.15 μm.

Comparative Example 1

An array of FIG. 5A without addition regions is prepared in which −40 nm misalignment is between the floating gate and the OD region.

Comparative Example 2

An array of FIG. 5A without addition regions is prepared in which −20 nm misalignment is between the floating gate and the OD region.

Comparative Example 3

An array of FIG. 5A without addition regions is prepared in which +20 nm misalignment is between the floating gate and the OD region.

Comparative Example 4

An array of FIG. 5A without addition regions is prepared in which +40 nm misalignment is between the floating gate and the OD region.

Experimental Example 1

An array of FIG. 5A with the addition regions is prepared in which no misalignment is between floating gate and OD regions.

Experimental Example 2

An array of FIG. 5A with the addition regions is prepared in which +40 misalignment is between the floating gate and the OD region.

Experimental Example 3

An array of FIG. 5A with the addition regions is prepared in which −40 misalignment is between the floating gate and the OD region.
<Analysis>

The standard sample and Comparative Examples 1-4 are tested to show cell read current with erase (ERS) time under different floating gate and OD misalignment. The result is illustrated in FIG. 6.

Figure 7:
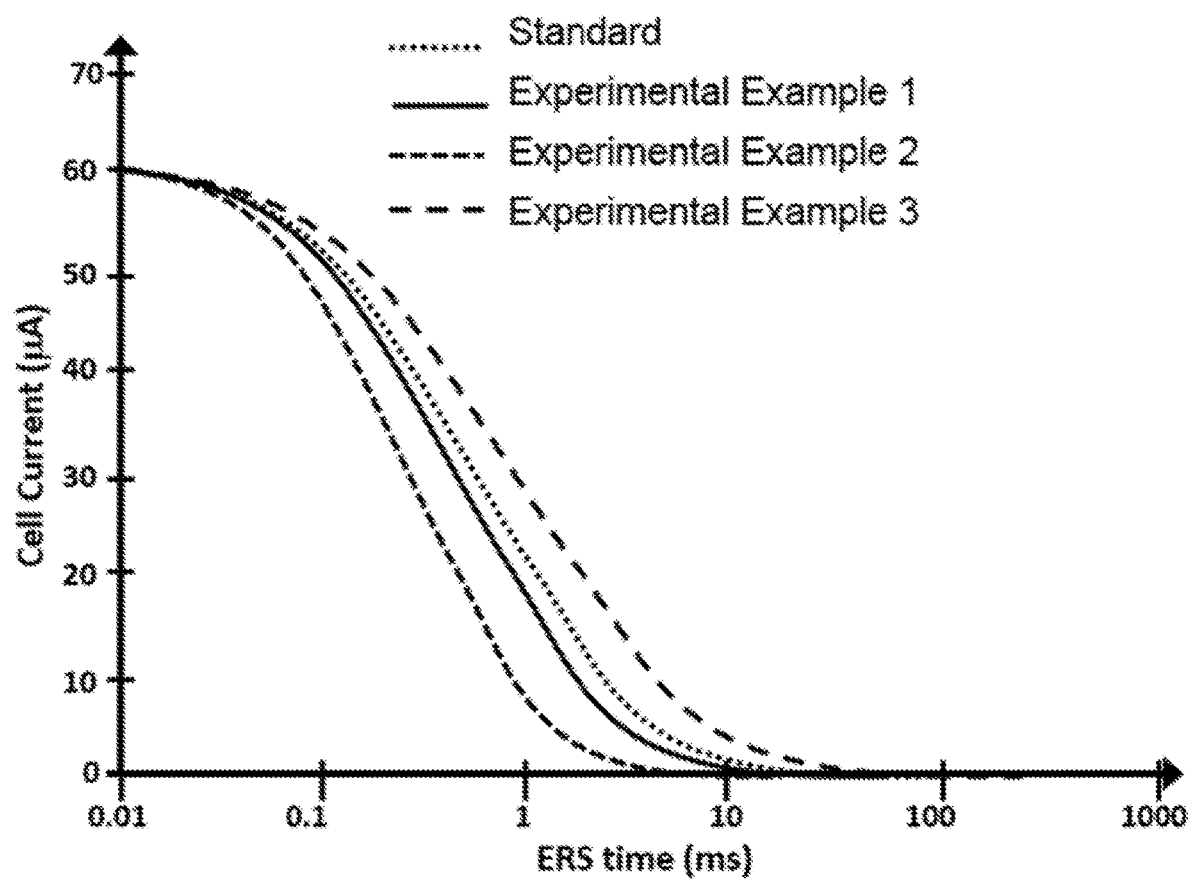
FIG. 7 is a current-ERS time curve diagram of standard and Experimental Examples 1-3.

The standard sample and Experimental Examples 1-3 are also tested to show cell read current with ERS time under different floating gate and OD misalignment. The result is illustrated in FIG. 7.

Figure 6:
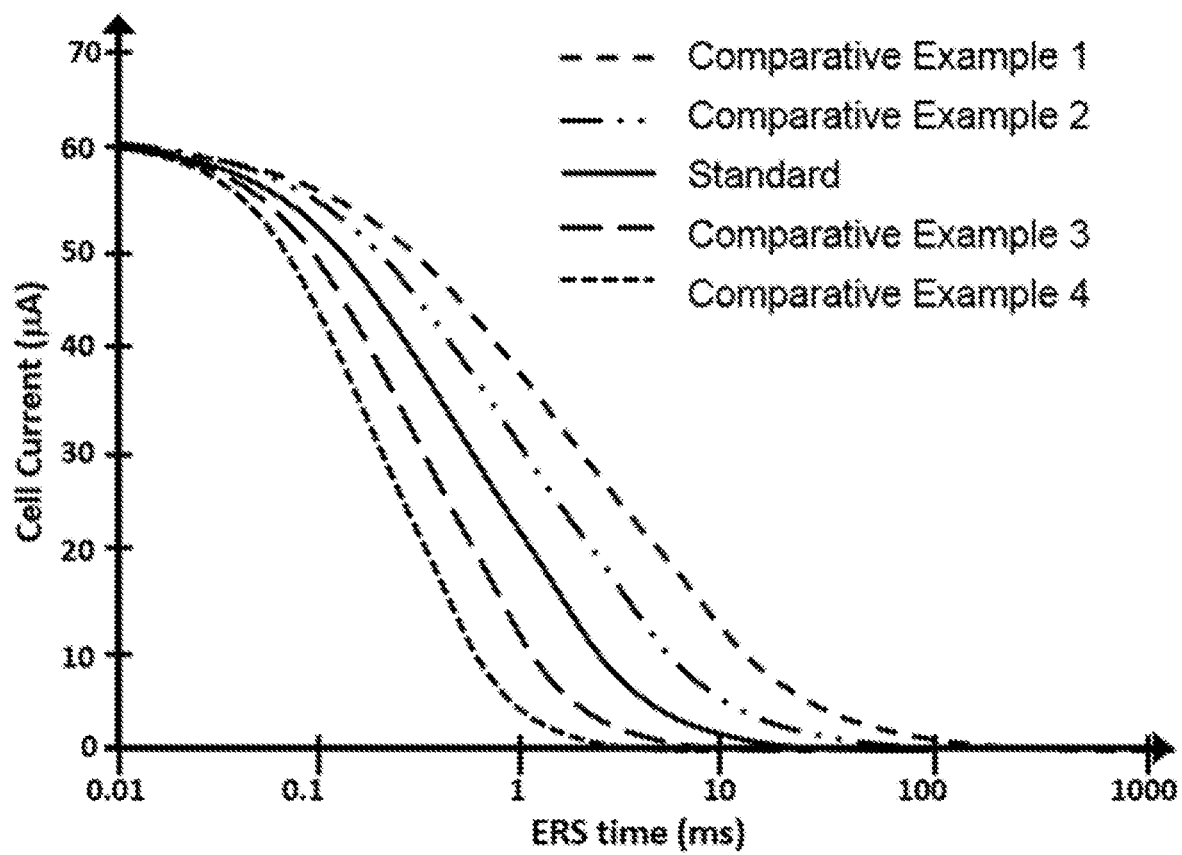
FIG. 6 is a current-ERS time curve diagram of standard and Comparative Examples 1-4.

It is seen from FIG. 6 that the erase time of comparative example 1 is longer than that of standard in the same current. Based on the same misalignment, the difference of the erase time between Experimental Example 3 and standard (in FIG. 7) is much less than that of the erase time between comparative example 1 and standard (in FIG. 6).

In summary, the nonvolatile memory structures of the above embodiments have addition regions in the OD region, and thus it can reduce the difference in coupling ratio easily and effectively.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A nonvolatile memory structure, comprising:
a substrate comprising an oxide defined (OD) region and an erase region;
a select transistor disposed on the OD region; and
a floating-gate transistor disposed on the OD region between the select transistor and the erase region, wherein the floating-gate transistor comprises a floating gate having an extended portion capacitively coupled to the erase region, and the extended portion has an extending direction parallel to a first direction, wherein the OD region has at least one addition region protruding in a second direction and partially overlapped with the floating gate, wherein the second direction is vertical to the first direction, and
an area of the at least one addition region is A1, an overlap area between the floating gate and the addition region is A2, and a ratio of A2 to A1 is 0.5 or more.

2. The nonvolatile memory structure according to claim 1, wherein the addition region is disposed at one side of the OD region.

3. The nonvolatile memory structure according to claim 1, wherein the addition regions are disposed at two sides of the OD region.

4. The nonvolatile memory structure according to claim 1, wherein a width of the at least one addition region is equal to or more than a width of the extended portion of the floating gate.

5. The nonvolatile memory structure according to claim 1, wherein the erase region has a first conductive type, and the OD region has a second conductive type.

6. The nonvolatile memory structure according to claim 5, wherein the first conductive type is p type, and the second conductive type is n type.

7. The nonvolatile memory structure according to claim 1, further comprising a word line disposed on the select transistor and along the second direction.

8. An array comprising a plurality of nonvolatile memory structures according to claim 1.

9. A nonvolatile memory structure, comprising:
a substrate comprising a first oxide defined (OD) region, a second OD region, and an erase region, wherein the first OD region and the second OD region are arranged in parallel along a first direction, and the erase region is extended along a second direction;
a first select transistor disposed on the first OD region;
a first floating-gate transistor disposed on the first OD region between the first select transistor and the erase region, wherein the first floating-gate transistor comprises a first floating gate having an extended portion capacitively coupled to the erase region; and
a second select transistor disposed on the second OD region; and
a second floating-gate transistor disposed on the second OD region between the second select transistor and the erase region, wherein the second floating-gate transistor comprises a second floating gate having an extended portion capacitively coupled to the erase region, wherein
the first OD region has at least one first addition region protruding in the second direction and partially overlapped with the first floating gate,
the second OD region has at least one second addition region protruding in the second direction and partially overlapped with the second floating gate, and
an area of the at least one first addition region is A1, an overlap area between the first floating gate and the first addition region is A2, and a ratio of A2 to A1 is 0.5 or more.

10. The nonvolatile memory structure according to claim 9, wherein the first addition region is disposed at one side of the first OD region.

11. The nonvolatile memory structure according to claim 9, wherein the first addition regions are disposed at two sides of the first OD region.

12. The nonvolatile memory structure according to claim 9, wherein the second addition region is disposed at one side of the second OD region.

13. The nonvolatile memory structure according to claim 9, wherein the second addition regions are disposed at two sides of the second OD region.

14. The nonvolatile memory structure according to claim 9, wherein a width of the at least one first addition region is equal to or more than a width of the extended portion of the first floating gate.

15. The nonvolatile memory structure according to claim 9, wherein a width of the at least one second addition region is equal to or more than a width of the extended portion of the second floating gate.

16. The nonvolatile memory structure according to claim 9, wherein the erase region has a first conductive type, the first OD region and the second OD region have a second conductive type.

17. The nonvolatile memory structure according to claim 16, wherein the first conductive type is p type, and the second conductive type is n type.

18. The nonvolatile memory structure according to claim 9, further comprising a word line disposed on the first select transistor and the second select transistor along the second direction.

19. The nonvolatile memory structure according to claim 9, wherein the extended portions of the first floating gate and the second floating gate are disposed between the first OD region and the second OD region.

20. The nonvolatile memory structure according to claim 9, wherein the extended portions of the first floating gate and the second floating gate are disposed outside the first OD region and the second OD region.

21. The nonvolatile memory structure according to claim 9, wherein the extended portion of the first floating gate has an extending direction parallel to the first direction.

22. The nonvolatile memory structure according to claim 9, wherein the extended portion of the second floating gate has an extending direction parallel to the first direction.

23. An array comprising a plurality of nonvolatile memory structures according to claim 9, in which two of the nonvolatile memory structures share the one erase region, and the two of the nonvolatile memory structures are arranged mirror-symmetrically on two sides of the one erase region respectively.

24. A nonvolatile memory structure, comprising:
a substrate comprising a first oxide defined (OD) region, a second OD region, and an erase region, wherein the first OD region and the second OD region are arranged in parallel along a first direction, and the erase region is extended along a second direction;
a first select transistor disposed on the first OD region;
a first floating-gate transistor disposed on the first OD region between the first select transistor and the erase region, wherein the first floating-gate transistor comprises a first floating gate having an extended portion capacitively coupled to the erase region; and
a second select transistor disposed on the second OD region; and
a second floating-gate transistor disposed on the second OD region between the second select transistor and the erase region, wherein the second floating-gate transistor comprises a second floating gate having an extended portion capacitively coupled to the erase region, wherein
the first OD region has at least one first addition region protruding in the second direction and partially overlapped with the first floating gate,
the second OD region has at least one second addition region protruding in the second direction and partially overlapped with the second floating gate, and
an area of the at least one second addition region is A3, an overlap area between the second floating gate and the second addition region is A4, and a ratio of A4 to A3 is 0.5 or more.

* * * * *